United States Patent [19]
Zory, Jr. et al.

[11] Patent Number: 6,063,642
[45] Date of Patent: May 16, 2000

[54] METHOD FOR GENERATING LUMINESCENCE FROM A BURIED LAYER IN A MULTILAYER COMPOUND SEMICONDUCTOR MATERIAL USING A LIQUID CONTACT

[75] Inventors: Peter S. Zory, Jr., Gainesville, Fla.; Douglas A. Hudson, Jr., Denver, Colo.; Michael J. Grove, Stafford, Va.; Craig C. Largent, Gainsville, Fla.

[73] Assignee: Peter S. Zory, Gainesville, Fla.

[21] Appl. No.: 08/719,012

[22] Filed: Sep. 24, 1996

Related U.S. Application Data

[63] Continuation-in-part of application No. 08/339,811, Nov. 15, 1994, Pat. No. 5,559,058.

[51] Int. Cl.$^7$ .................................................. H01L 21/00
[52] U.S. Cl. ............................ 438/29; 438/46; 438/103
[58] Field of Search ......................... 438/14, 29, 46, 438/47, 99, 102, 103, 466, 974

[56] References Cited

U.S. PATENT DOCUMENTS

| | | | |
|---|---|---|---|
| 4,675,087 | 6/1987 | Tregilgas et al. | 204/141.5 |
| 4,723,262 | 2/1988 | Noda et al. | 378/119 |
| 5,087,587 | 2/1992 | Morimoto et al. | 437/129 |
| 5,366,927 | 11/1994 | Schetzina | 437/185 |
| 5,399,502 | 3/1995 | Friend | 437/1 |
| 5,470,785 | 11/1995 | Kondo | 437/129 |
| 5,529,938 | 6/1996 | Umeda et al. | 437/22 |
| 5,571,321 | 11/1996 | Yanagisawa et al. | 117/56 |
| 5,587,335 | 12/1996 | Mori et al. | 437/129 |
| 5,593,901 | 1/1997 | Oswald et al. | 437/2 |

Primary Examiner—Charles Bowers
Assistant Examiner—Reneé R. Berry
Attorney, Agent, or Firm—Rodney T. Hodgson

[57] ABSTRACT

A method is disclosed for generating light in one or more buried layers of a multilayer compound semiconductor material by contacting the material with a tansparent, electrically conducting fluid and passing current between the fluid and the semiconductor material. The measured characteristics of the light emitted from a first semiconductor material may be compared with those measured from a second semiconductor material of known properties, and the properties of the first semiconductor material calculated. Uniformity maps of the compound semiconductor material may be prepared using the patterns of various light emission characteristics measured across the surface of the material.

17 Claims, 9 Drawing Sheets

METHOD FOR GENERATING LUMINESCENCE FROM A BURIED LAYER IN A MULTILAYER COMPOUND SEMICONDUCTOR MATERIAL USING A LIQUID CONTACT

This application is a continuation in part of U.S. application Ser. No. 08/339,811, now U.S. Pat. No. 5,559,058, entitled Improved method for producing native oxides on compound semiconductors, by P. S. Zory, Douglas Hudson, and Michael Grove, filed on Nov. 15, 1994, which application is incorporated by reference.

BACKGROUND OF THE INVENTION

1. Field of the Invention

The present invention relates to a method for generating luminescence in one or more buried layers in a multilayer compound semiconductor material. More specifically, the present invention uses an electrically conducting fluid to contact a multilayer compound semiconductor material. Some examples of inorganic compound semiconductor materials of interest include AlGaAs, InGaAs, GaInP InGaN and CdZnSe. Examples of organic compound semiconductor materials of interest include Gaq3 (q=8-hydroxyquinolate), Alq2OPh and PPV (poly-paraphenylenevinylene). When an electrical current is passed into the multilayer semiconductor material, electrons and holes are generated in the material which recombine in one or more buried layers to produce light. The characteristics of the light emitted through the surface of the material and through the transparent conducting fluid in contact with the surface can be measured and used to determine the quality of the multilayer compound semiconductor material or wafer. Using various processing techniques to create individually addressable areas on the surface of the wafer converts the conducting fluid/patterned-wafer combination into a device capable of information display.

2. Background of the Invention

Group III–V inorganic multilayer compound semiconductor materials have found wide use in high speed electronic and various optoelectronic applications. Group II–VI inorganic semiconductors have recently assumed importance because new, short wavelength lasers have been produced using ZnSe-based materials. In the last few years, organic semiconductor materials such as Gaq3 and PPV have received considerable attention for possible use in low cost flat panel displays. An inexpensive and simple method for determining the quality of such semiconductor materials would decrease fabrication costs and broaden their use. Laser induced luminescence has been used to determine the quality of both single and multilayer wafers fabricated from such materials. However, when the multilayer wafer contains a p-n junction, it is very difficult to determine material quality since the relationship between pump laser intensity and effective current density is difficult to establish. This is due to the fact that the effective current density provided by the laser beam depends on the reflectivity, absorption and transmission characteristics of the wafer at the lasing wavelength and the nature of the minority carrier transport processes in the wafer. Using a transparent, electrically conducting fluid to generate luminescence, one can easily measure the actual current density through the wafer and thence obtain an accurate determination of material quality.

In the area of information display, light-emitting diode arrays are well-known although they have not been widely used because of high fabrication costs. An inexpensive method for driving such arrays using a transparent, electrically conducting fluid would broaden the use of such devices. In addition, the encapsulation process required to achieve useful life-times for multilayer organic semiconductor light-emitting devices may be simplified through the use of electrically conducting drive fluids thereby broadening their use.

SUMMARY OF THE INVENTION

The method of present invention uses a transparent, conducting fluid to electrically contact and pass electrical current into a multilayer compound semiconductor material. Electrons and holes are injected into the material and recombine in one or more buried layers to produce light. The brightness and spectral characteristics of the emitted light as a function of current can be measured and used to determine the quality of the material.

In further accordance with the present invention, the characteristics of the light emitted from a test wafer are compared with those of light emitted from a semiconductor wafer from which devices have been made and measured. The comparison is used to predict the characteristics of the devices made from the test wafer.

In further accordance with the present invention, the variation in light emission with position on the wafer being evaluated may be recorded and used to determine the parts of the wafer which have poor quality.

In further accordance with the present invention, various processing techniques are used to create individually addressable areas on the surface of a light-emitting wafer. The resulting conducting-fluid/patterned-wafer combination is used to display information in a flat panel-type format.

BRIEF DESCRIPTION OF THE DRAWINGS

FIG. 2a. Spontaneous emission spectra obtained at various currents I from a 7 nm thick GaAs quantum well QW layer buried in a multilayer epitaxial wafer.

FIG. 2b. Plot of the integrated spontaneous emission intensity S vs. I from the spectral data in FIG. 2a.

FIG. 3a. Spontaneous emission spectra obtained from the 4 nm thick CdZnSe QW layer buried in the multilayer epaitaxial wafer.

FIG. 3b. S-I plot from the spectral data in FIG. 3a.

FIG. 5a. Spontaneous emission spectra obtained at various currents I from the 8 nm thick GaInP QW layer buried in the multilayer structure shown in FIG. 4.

FIG. 5b. S-I plot from the spectral data in FIG. 5a.

FIG. 6a. Spontaneous emission spectra obtained at various currents I from the 7 nm thick GaInP layer buried in the multilayer structure shown in FIG. 4.

FIG. 6b. S-I plot from the spectral data in FIG. 6a.

DETAILED DESCRIPTION OF THE INVENTION

We have shown in application Ser. No. 08/339,811 that diode laser material luminesces during pulsed anodic oxidation. The spectrum of this pulsed anodization luminescence (PAL) indicates that the light is generated in the quantum well (QW) of the structure and is equivalent to that obtained using conventional photoluminescence (PL). Since the light is emitted after the current pulse is turned off, the charge carriers responsible for PAL are most likely stored in the oxide layer when the current pulse is on. If the electrode polarity is reversed, no oxidation takes place and the light is emitted during the current pulse. In this case, the polarity of the electrodes is such that the diode material is forward biased and the liquid electrolyte takes the place of the p-metal contact. Following are observations using this nondestructive, liquid contact luminescence (LCL) technique with GaAs and CdZnSe single QW laser material.

Figure 1A:
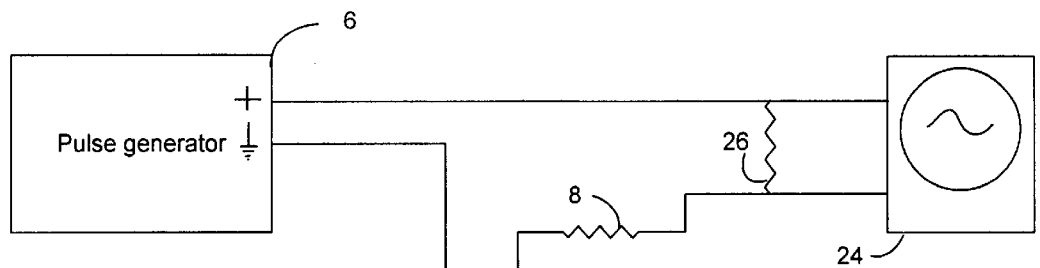
FIG. 1a. The experimental set-up used in the liquid contact luminescence (LCL) measurements.
Figure 1A:
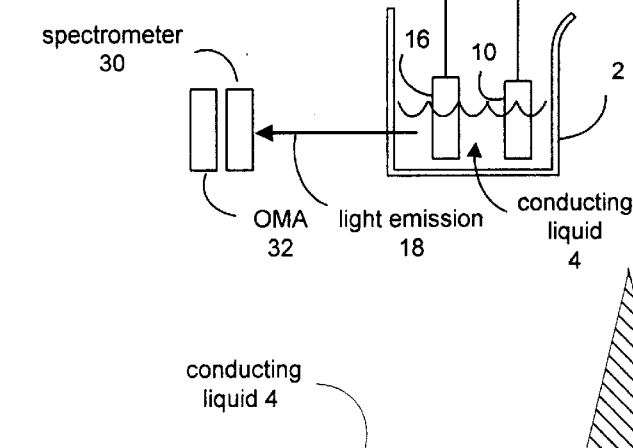
Figure 1:
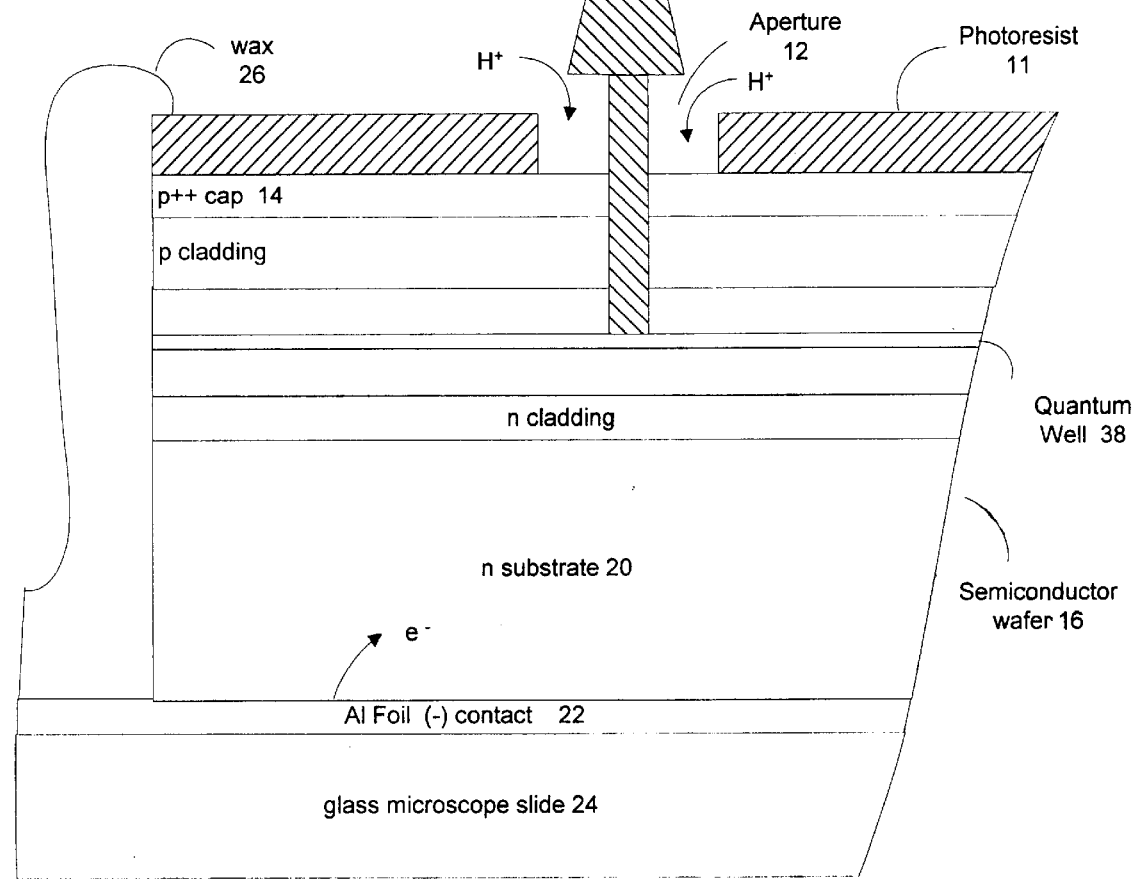
FIG. 1b. Detail of sample set up.

The experimental set-up used in the LCL measurements is shown in FIG. 1. The sample was placed in a beaker containing a conducting liquid 4. A pulse generator 6 was used to supply current I to the sample. The value of the current I was controlled by the variable resistor 8. A platinum electrode 10 was used as an anode. A phototresist 11 was deposited on the sample surface. A standard photoresist technique was used to define a 1 mm square aperture 12 for current injection I into the p-side 14 of the sample in the form of a semiconductor laser material 16. When voltage is applied as shown, holes are injected into the p material 14 from the liquid contact and light 18 from electron-hole recombination in the QW 38 is generated. The n-side 20 of the wafer 16 makes contact to an aluminum foil stripe 22 fixed to a glass microscope slide 24 and is electrically isolated from the conducting liquid using wax 26. The only current path through the wafer 16 is through aperture 12. The platinum or platinized titanium electrode 10 and the aluminum foil 22 contact to the n-side 20 of the wafer 16 are then connected to "+" and "−" sides respectively of the pulse generator 6. The oscilloscope 24 and the resistor 26 are used to measure the current I flowing through the semiconductor wafer 16. A spectrometer 30 and optical multichannel analyzer (OMA) 32 facing the p-side 14 of the wafer 16 records the spectrum of the light 18 coming through the wafer surface 14. In order for current to flow, we believe that these hydrogen ions capture electrons from the p+-cap layer 14 creating holes in the valence band. Since this process is essentially hole injection into the p+-cap layer 14, the conducting fluid acts like a metal contact. Meanwhile, as shown in FIG. 1b, electrons are injected into the n-substrate 36 from the n-contact aluminum foil 22. The injected holes and electrons then drift toward the QW layer 38 where some fraction of them recombine. If we define this fraction to be the internal quantum efficiency or injection efficiency $\eta_i$, then $\eta_i I$ is the QW recombination current.

Figure 2:
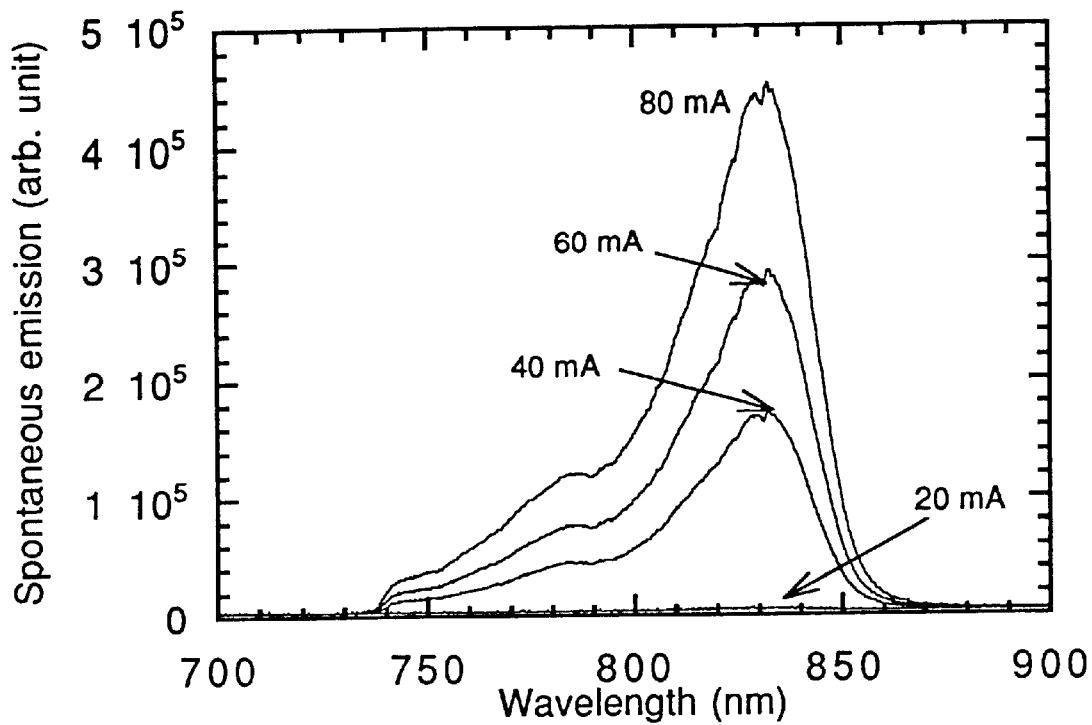
Figure 2:
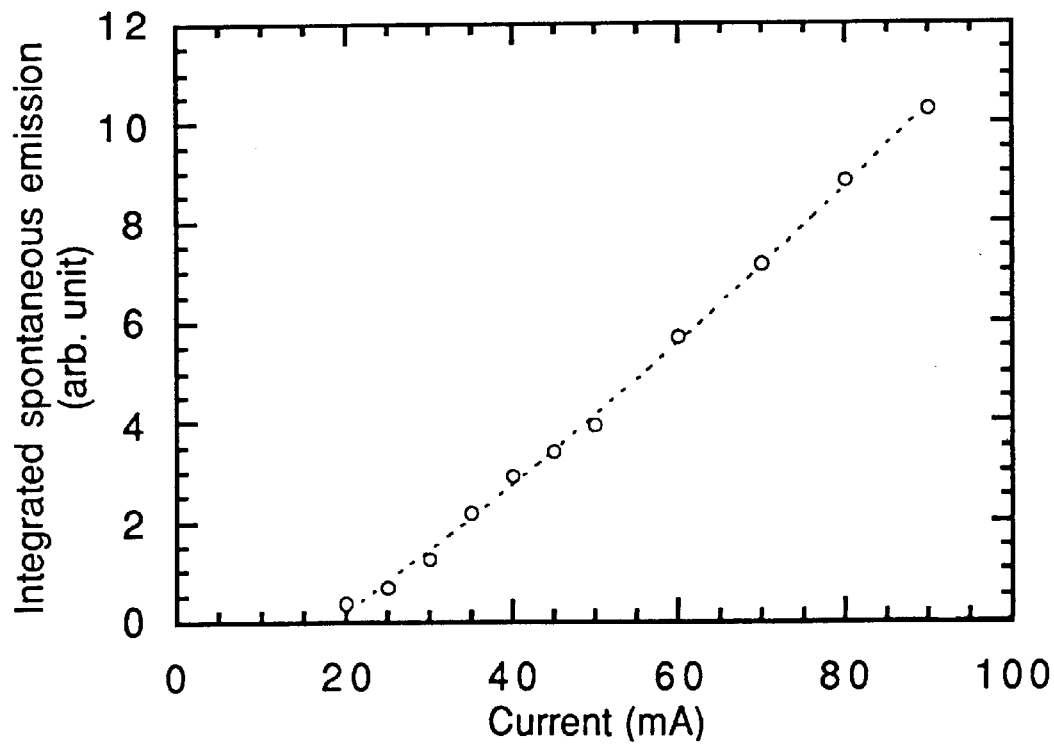
Figure 3:
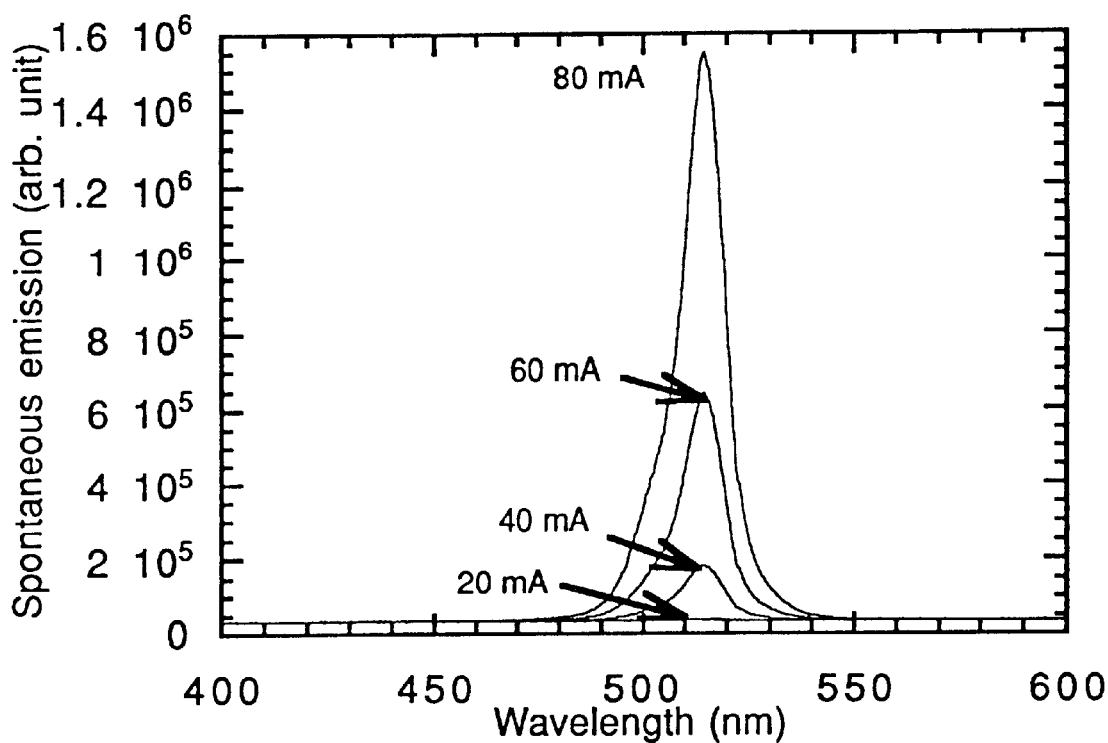
Figure 3:
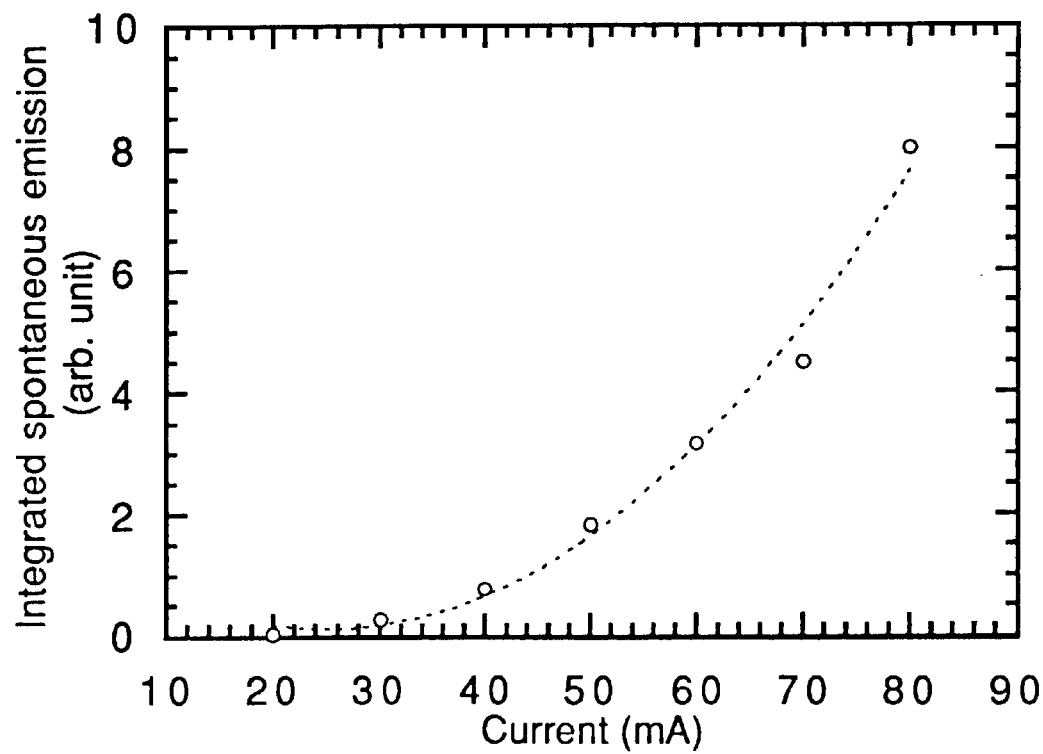

Two single QW laser wafers measured as examples were grown in the standard separate confinement heterojunction configuration. FIG. 2(a) shows the spontaneous emission spectrum obtained from the 7 nm thick GaAs QW wafer at various I values using the OMA. FIG. 2(b) is a plot of the integrated spontaneous emission intensity (S) vs. I. FIG. 3(a) shows the spontaneous emission spectrum obtained from a 4 nm thick CdZnSe QW wafer and FIG. 3(b) shows the corresponding S-I plot.

Under the assumption that the fraction of current which gives rise to recombination in the QW is independent of I, the nonlinear nature of the S-I plots indicates that some of the QW recombination processes do not contribute to the spontaneous emission. The fact that the CdZnSe S-I plot is considerably more nonlinear than the GaAs S-I plot may be the signature of the processes responsible for the lifetime problem which presently plagues lasers made from this material.

During the pulsed anodization of GaInP single quantum well (QW) material discussed in application Ser. No. 08/339,811, we found that red light was emitted from the portion of the wafer undergoing pulsed anodization. When the oxidation process first begins, no light is emitted. After 45 seconds, the emission starts and increases until the oxide reaches its final thickness, where the light emission saturates. The PAL spectrum of the light was measured found to be similar to the photoluminescence (PL) spectrum. A comparison of the peak emission wavelength and half-width of the PAL and PL spectra are shown in Table I. This data can be used to predict the lasing wavelength. We found that the light is emitted after the anodizing pulse, and surmise that the charged capacitor formed by the wafer, the oxide, and the GWA solution drives a reverse current into the wafer. This current forms electron hole pairs which recombine in the QW active layer to emit light.

Table 1 Comparison of PL and PAL spectral data for GaInP single QW laser material. Lasing wavelength for lasers made from same material is also shown.

|  | Peak Wavelength (nm) | Half width (nm) |
|---|---|---|
| PAL | 650 | 15 |
| PL | 649 | 16 |
| Laser | 665 | |

As discussed above, when the direction of current flow is reversed from that used during pulsed anodization, the material is forward biased and the spectral characteristics of the luminescence (LCL) are the same as the PAL spectra. When this was done using unoxidized GaInP single QW red laser material, the LCL could be obtained using a constant current drive with no apparent etching or damage to the surface of the wafer. This suggests that the LCL technique can be used as a simple diagnostic tool to check the quality and uniformity of the QW active layer across the wafer and to check for defects which would trap the electron hole pairs and reduce the light emission. Presently, the material is usually pumped with a laser and the light emission pattern scanned to detect such non uniformities and defects. Using a set up as in FIG. 1, a picture of the luminescent pattern from a wafer immersed in the conducting fluid may be taken and used as a wafer map to point out defective areas which would show up as relatively darker areas in the picture. In this case, no photoresist need be used to restrict current flow to any particular portion of the surface of the wafer. This wafer map could then be transmitted in hardcopy or as a computer file along with the wafer to decide the placement of the processing patterns on the wafer, or to decide which areas of the wafer to discard after wafer level processing and before final assembly and test of chips diced from the wafer.

A parameter $\eta_i$ usually called the internal quantum efficiency of a laser, is one of the key parameters used to quantify the performance of semiconductor lasers. The conventional method for determining $\eta_i$ usually involves the fabrication and pulse-testing of at least three sets of widestripe lasers with different cavity lengths. From the measured slope efficiencies one then extracts $\eta_i$. Since this determination of $\eta_i$ involves a substantial amount of work and uses up laser material, we have invented a simple, nondestructive method using the liquid contact luminescence (LCL) technique which can be used at the unprocessed wafer level to predict the relative $\eta_i$ value for the wafer.

The diode laser material is forward biased using the conducting fluid 4 to contact the standard p+-cap layer as in FIG. 1b. The LCL electrochemical setup shown in FIG. 1 was modified by replacing the pulse generator with a constant current supply, and by replacing the oscilloscope and resistors and with an ammeter to provide a measurement of the continuous current supply I to the wafer. In the experiments described hereinafter, the conducting fluid was transparent enough to the spontaneous emission emitted from the buried GaInP single QW active layers that one could easily measure the spectrum of the emitted light from each wafer as a function of current through the wafer.

Measurements of the integrated spontaneous emission vs current density in conjunction with modeling can be used to determine the non-radiative lifetime of carriers in the quantum well. LCL can then be used to determine relative values of $\eta_i$ for high quality laser material.

In general, QW electron-hole recombination processes can be subdivided into spontaneous, non-radiative, and stimulated processes having corresponding rates $(R_{sp})$, $(R_{nr})$ and $(R_{st})$.

$$\eta_i \frac{I}{q} = R_{sp} + R_{nr} + R_{st} \quad (1)$$

where $I/q$ is the number of electrons and holes injected per second into the material. In high quality red laser material, one expect that $R_{sp} \gg R_{nr}$ and $R_{st}$ at current densities of a few A/cm$^2$. In this case, Eq. 1 simplifies to:

$$\eta_i \frac{I}{q} \approx R_{sp} \quad (2)$$

If current is run for time $\Delta t$, the number of photons generated in the quantum well will be $R_{sp} \Delta t$. However, only a fraction (F) of these photons will be collected by the spectrometer. Defining this photon number as $N_{ph}$, we can write, $$N_{ph} = R_{sp} \Delta t F = \frac{F \Delta t}{q} \eta_i I = K \eta_i I \quad (3)$$

where $K = F \Delta t/q$ is a constant. If $\eta_i$ does not depend on I and the Eq. (2) assumption is correct, then a plot of $N_{ph}$ vs I will be linear. If so, then the ratio of the slopes for two wafers will be equal to the ratio of their internal quantum efficiencies.

Figure 4:
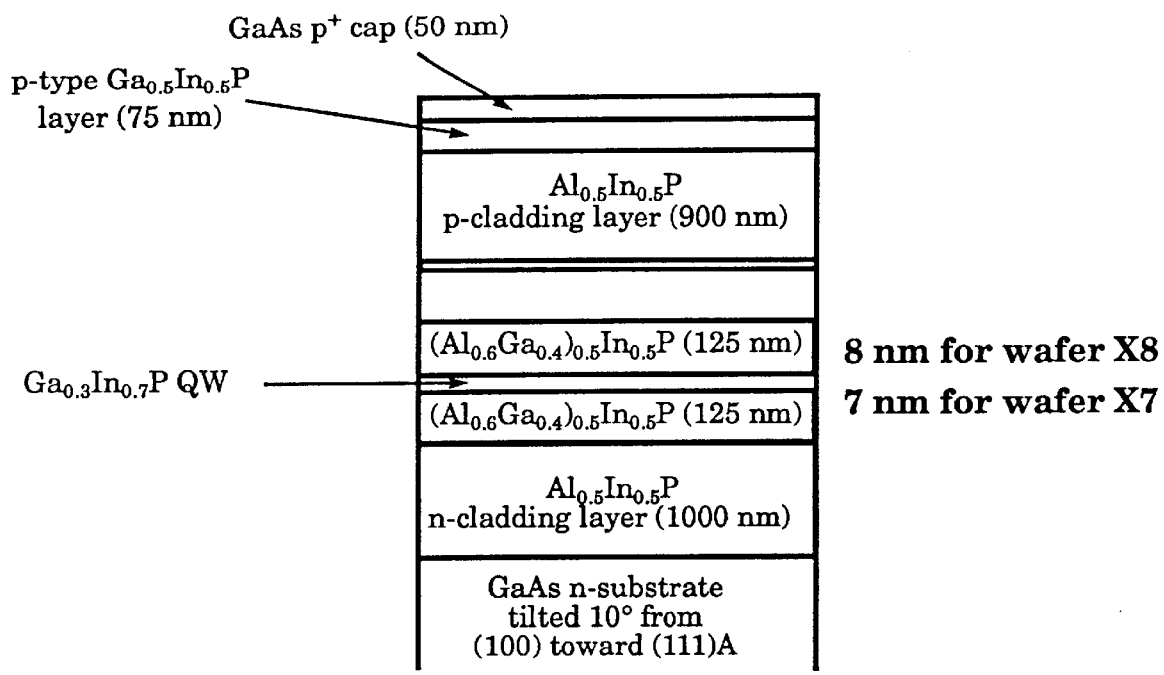
FIG. 4. Epitaxial structure for two red laser wafers studied, X8 and X 7.

FIG. 4 shows the epitaxial structure for two red laser wafers studied, X8 and X7. They are identical except for QW thickness, X8 is 8 nm and X7 is 7 nm.

Figure 5:
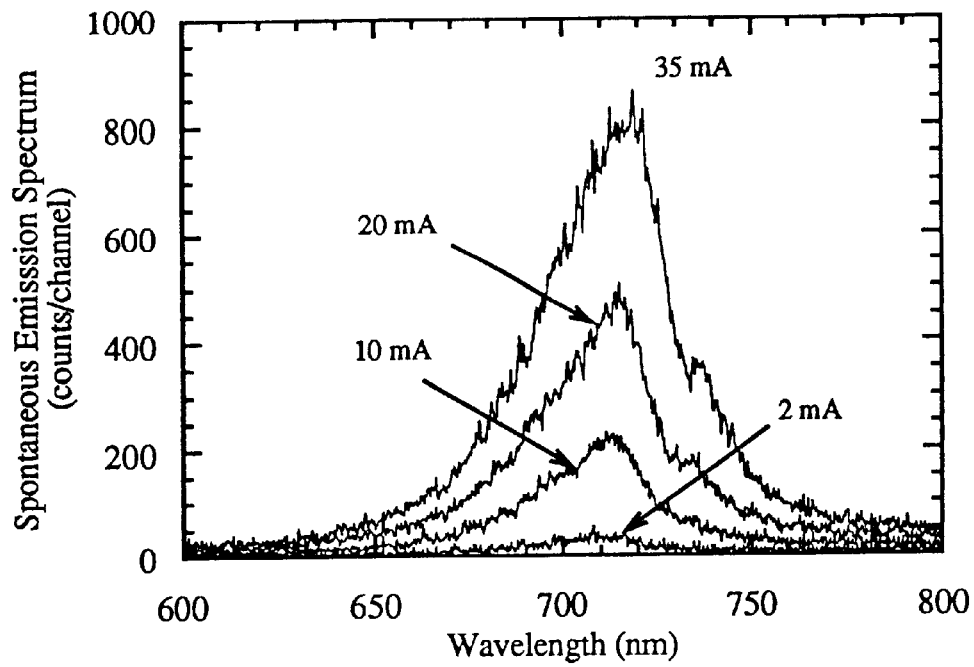
Figure 5:
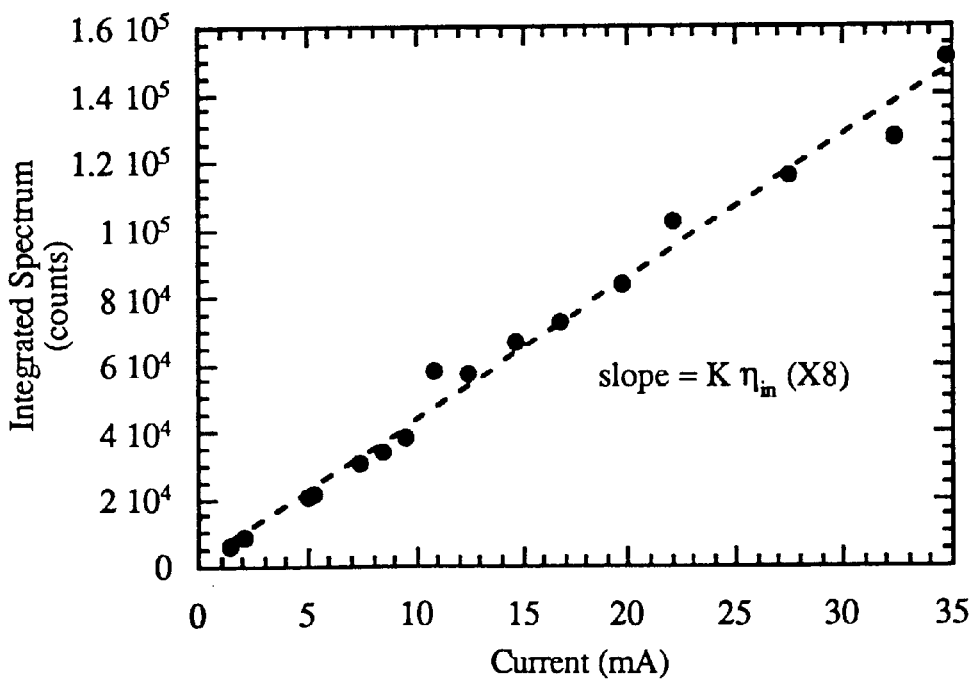
Figure 6:
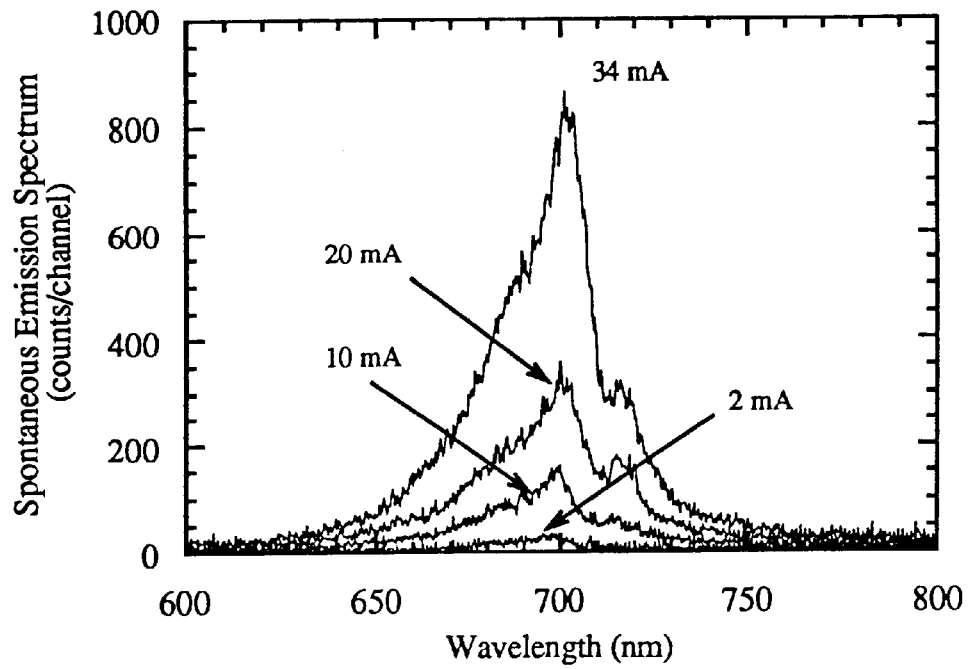
Figure 6:
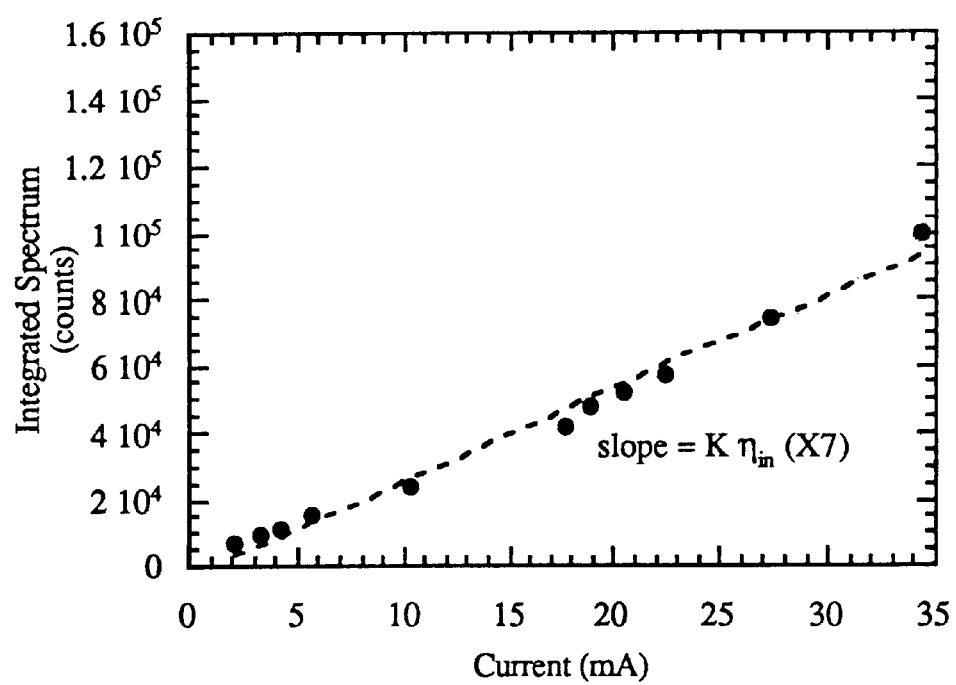

FIG. 5(a) shows the measured LCL spectra from wafer X8 at different current levels for a scan time of 20 msec. The total photon count $N_{ph}$ for a given I is obtained by adding up the total number of counts under the spectral envelope. $N_{ph}$, vs I for wafer X8 is plotted in FIG. 5(b). The data is fit to a straight line and the slope of this line is just the $K\eta_i$ of X8. FIGS. 6(a) and 6(b) show the results obtained for wafer X7. Comparing the slopes for X8 and X7, we get the internal quantum efficiency ratio $\eta_i$ (X8)/$\eta_i$ (X7)=1.51.

Assuming the output power vs current ($P_o$–I) curve of a diode laser is linear, one can define a slope efficiency $\eta_s$ as shown in Eq. 4.

$$\eta_s = \frac{P_o}{(I - I_{th})} = \left(\frac{P_o/h\nu}{(I - I_{th})/e}\right)\left(\frac{h\nu}{e}\right) = (\eta_d)(V_c) \quad (4)$$

In this equation, $h\nu$ is the energy of the laser photons of frequency $\nu$, and e is the charge on the electron. The parameter $\eta_d$ is called the differential quantum efficiency and the parameter$_c$ is the characteristic voltage. The parameter $\eta_d$ can be broken into two parts as indicated below $$\eta_d = \eta_i \eta_o \quad (5)$$

where $\eta_i$ is the internal quantum efficiency and $\eta_o$, is the output efficiency. The expression for $\eta_o$ is $$\eta_o = \frac{\frac{1}{2L}\ln\frac{1}{R_o}}{\alpha_i + \frac{1}{2L}\ln\frac{1}{R_o R_b}} \quad (6)$$

where $\alpha_i$ is the internal mode loss, L is the laser cavity length, and $R_o$ and $R_b$ are the mode power reflectivities of the facets ($R_o = R_b$ in our experiment). From the above three equations, one can obtain an expression for $\eta_s$ $$\frac{1}{\eta_s} = \left(\frac{2}{V_c \ln \frac{1}{R_o}}\left(\frac{\alpha_i}{\eta_i}\right)\right)L + \frac{1}{\eta_i V_c}\left(1 + \frac{\ln\frac{1}{R_b}}{\ln\frac{1}{R_b}}\right) \quad (7)$$

The parameter $\eta_i$ can be determined from the intercept of a plot of $1/\eta_s$ vs L.

$$\eta_i = \frac{1}{V_c(1/\eta_s)_{L=0}}\left(1 + \frac{\ln\frac{1}{R_b}}{\ln\frac{1}{R_o}}\right) \quad (8)$$

Figure 7:
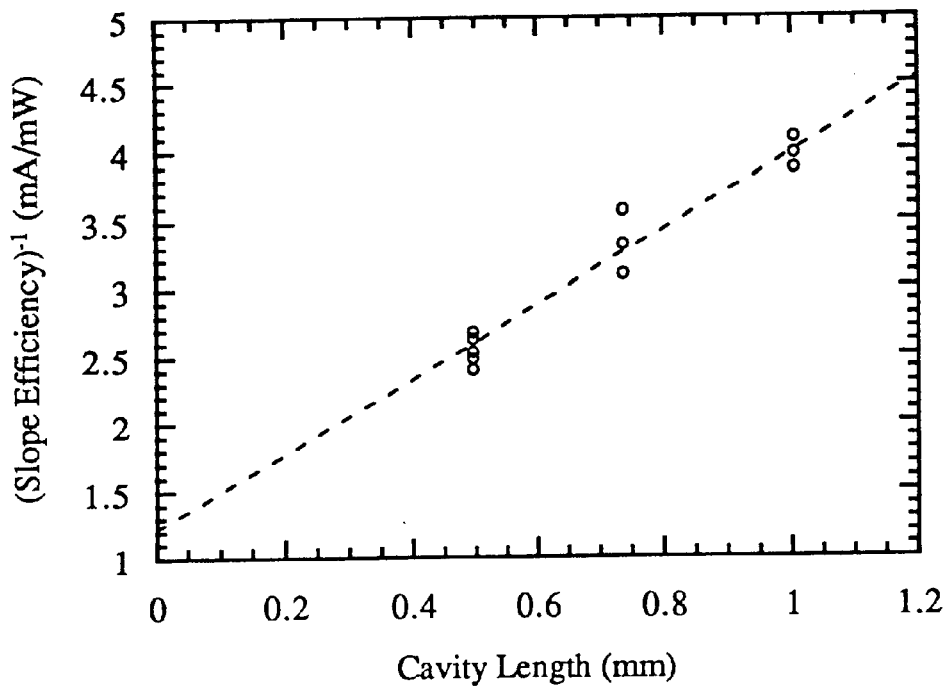
FIG. 7a. Measured inverse slope efficiency vs. cavity length L for lasers made from wafer X8.
FIG. 7b. Measured inverse slope efficiency vs. cavity length L for lasers made from wafer X7.
Figure 7:
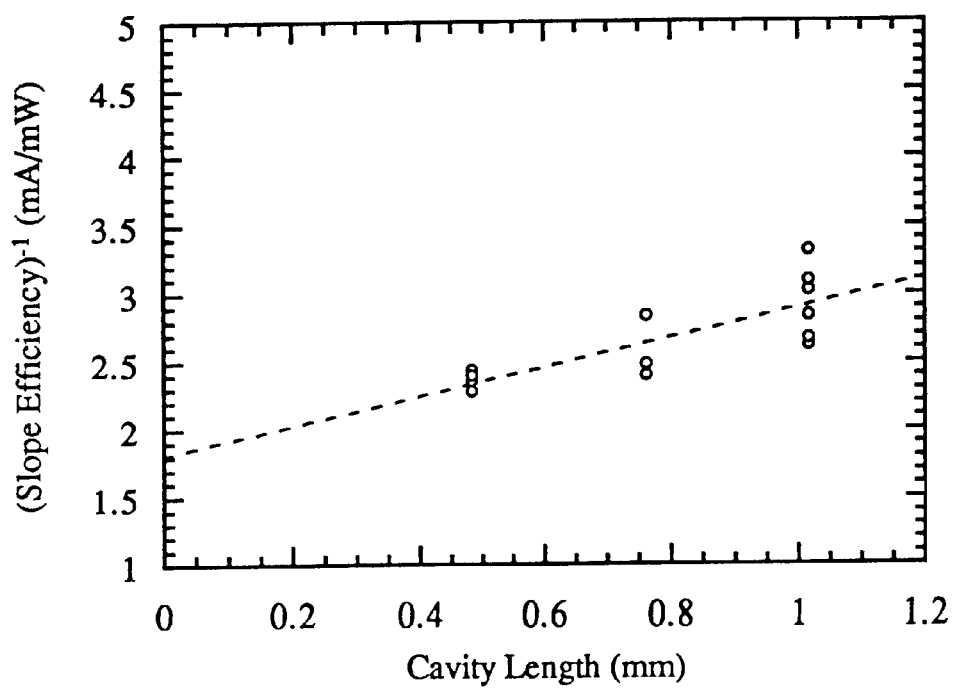

Lasers from wafer X8 and X7 were fabricated with three different cavity lengths (~0.5, 0.75, 1 mm). FIG. 7(a) and FIG. 7(b) show plots of the measured 1/$\eta$ vs L for wafers X8 and X7, respectively. The straight-line fits to the data are extrapolated to the vertical axis to find the intercepts, which are then used in Eq. 8 to find the $\eta_i$ parameters. The calculation yields $\eta_i$=0.93 for wafer X8 and $\eta_i$=0.62 for wafer X7. The $\eta_i$ ratio for these two wafers is $\eta_i$ (X8)/$\eta_i$ (X7)=1.50. This is in good agreement with the $\eta_i$ ratio=1.51 measured using LCL. This shows that the LCL method is a good way to predict relative $\eta_i$ values for diode laser wafers. It is interesting to note that while the $\eta_i$ value for wafer X8 is about 1.5× larger than that for wafer X7, the $\alpha_i$ parameter for X8 is almost 4 times larger that for X7 (27 cm$^{-1}$ vs 7.2 cm$^{-1}$ as determined from the data in FIG. 7). Consequently, long lasers made from X8 have lower slope efficiencies than those made from X7 even though their $\eta_i$ parameter is 1.5× larger. Since the spectral width of X8 is substantially larger than that for X7 (about 90 meV vs 60 meV as determined from the data in FIGS. 5 and 6), the measurement of the spectral width of the luminescence may be used to predict the relative α, coefficient.

The conducting fluid preferably comprises an aprotic liquid solvent solution which contains few free hydrogen ions (protons). Such aprotic solutions as known in the electrochemistry art as methanol, propylene carbonate (PC), acetonitrile, dimethylsulfoxide (DMSO), and N,N-diethylformamide (DMF) may be used. A plasma may also be used The proton free liquids are preferably used because we found that the proton containing liquids used in our previous work on oxidization of compound semiconductor materials formed bubbles of hydrogen at the surface of the semiconductor material, and that these bubbles could interfere with the regular current density necessary for accurate measurements. The bubbles also changed the optical path and could scatter light and change the proportion of the light emitted by the wafer which was captured by the OMA. It became apparent that the GWA electrolyte, which was initially developed for pulsed anodization, was not ideal for LCL. The solvent, deionized water, also served as a redox couple, resulting in $H_2$ bubbles. The phosphoric acid, which served as some sort of supporting electrolyte, only increased the $H^+$ ion concentration, thereby increasing the probability of electrolysis. Of the above mentioned aprotic solvents, methanol and propylene carbonate (PC) are preferred because they are non toxic and easy to use in the open laboratory experiments described.

A supporting electrolyte which provides mobile ions to the solution is preferred to reduce the resistance of the conducting fluid. In both polagraphic and preparative electrochemistry in aprotic solvents, the custom is to use tetraalkylammonium salts as supporting electrolytes. The tetra-n-butyl salts are more difficult to reduce than the tetraethylammonium salts and are preferred in the electrochemistry art when maximum cathodic range is needed For maximum anodic range, the perchlorate or tetrafluoroborate counter ions are often preferred in the electrochemistry art because they are not readily oxidized. In fact, according to the literature, the tetafluoroborate ion gives slightly greater anodic range than the perchlorate ion. We have found that the perchlorate ion is not inert, so we have used the tetrafluoroborate ion, which works best in the method of these the most preferred supporting electrolyte.

In addition, a redox agent dissolved in the solvent is preferred to enable reversible electron transfer to occur at the electrodes to take the place of the $H_2$ formation at the electrodes. All chemical reactions can be classified in two groups: reactions that involve a transfer of electrons from one reactant to another during the reaction and reactions without electron transfer. Chemical reactions in which electrons are transferred from one species to another are called oxidation-reduction reactions, commonly called redox reactions. An example of a d reaction is the reaction between zinc and $Cu^{2+}(aq)$ ions in aqueous solution:

$$Zn(s) + Cu^{2+}(aq) \rightarrow Cu(s) + Zn^{2+}(aq) \tag{1}$$

In this reaction, the copper ion is said to be "reduced" to solid copper because of the addition of electrons:

(2)

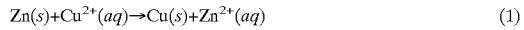

In a complimentary fashion, the solid zinc is said to be "oxidized" as it -has lost electrons:

(3)

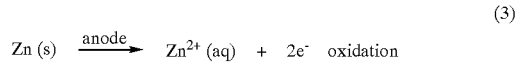

As one can see from the above reactions, the redox reaction in Reaction 1 can be obtained by the addition of Reaction 2 and Reaction 3. These simultaneous reduction and oxidation reactions are called half-reactions. Note that the oxidation half-reaction supplies electrons used in the reduction half-reaction. The overall chemical reaction in an electrochemical cell is really the combination of two half-reactions, which are occurring at the two electrodes in the cell. Because our interest is in the reaction occurring at the semiconductor, specifically the hydrogen bubbles being produced during the LCL process, this electrode is referred to as the working electrode, while the platinized titanium grid is referred to as the counter-electrode. In order to focus on the working electrode, standardization is accomplished by use of a reference electrode, either the normal hydrogen electrode (NHE) or the saturated calomel electrode (SCE), which has a potential of 0.242 V vs. NHE and the potential of the working electrode is measured with respect to the reference. If the working electrode is biased to negative potentials with respect to the NHE, the energy of the electrons within the electrode is raised and they will eventually flow from the electrode to the solution, resulting in a reduction current The potential at which this current begins to flow is related to the standard potential, $E_o$ for the specific chemical substances in the system. In the case of the initial LCL experiments, in which the electrolyte consisted of ethylene glycol, phosphoric acid, and deionized water, the reduction of hydrogen ions and the oxidation of water molecules occurred, resulting in the electrolysis of water as shown in the following equations:

(4)

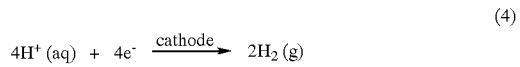

(5)

(6)

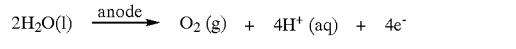

Results of experiments using the aprotic solvents methonol and propylene carbonate (PC) are shown in the following table II.

TABLE II

Solvent/electrolyte/redox couple combinations and light emission results. Abbreviations used in the table: TMPD = N,N,N',N' tetramethyl-p-phenylene diamine; TBAP = tetrabutylammonium perchlorate, TBAI = tetrabutylammonium iodide.

| Solvent | Electrolyte (Molarity) | Redox Couple (Molarity) | Solution Resistance (Ω) | Bubble Formation | Light Emission |
|---|---|---|---|---|---|
| Methanol | LiClO$_4$ (0.5) | Ferrocene (0.1) | 200 | Yes | No |
| Methanol | LiClO$_4$ (1.0) | Ferrocene (0.05) | 100 | Yes | No |
| Methanol | LiClO$_4$ (1.0) | Acetyl Ferrocene (0.1) | 160 | Yes | No |
| Methanol | LiClO$_4$ (1.0) | TMPD (0.05) | † | Yes | No |

TABLE II-continued

Solvent/electrolyte/redox couple combinations and light emission results. Abbreviations used in the table: TMPD = N,N,N',N' tetramethyl-p-phenylene diamine; TBAP = tetrabutylammonium perchlorate, TBAI = tetrabutylammonium iodide.

| Solvent | Electrolyte (Molarity) | Redox Couple (Molarity) | Solution Resistance (Ω) | Bubble Formation | Light Emission |
|---|---|---|---|---|---|
| Propylene Carbonate | TBAP (0.2) | Ferrocene (0.05) | 300 | Few at edges | Yes |
| Propylene Carbonate | TBAP (0.1) | TMPD (0.05) | 5333* | No | Yes |
| Propylene Carbonate | TBAI (0.05) | Ferrocene (0.025) | 4571* | No | Yes |
| Propylene Carbonate | TBAI (0.05) | TMPD (0.05) | 6667* | No | Yes |
| Propylene Carbonate | LiClO$_4$ (0.5) | TMPD (0.05) | 2133* | Yes, small number | Initially, but quickly extinguished |

In all of the cases for which methanol was the solvent, a large number of bubbles were produced. In the fifth case noted in table 2, which used PC as the solvent, tetrabutylammonium perchlorate as theyte, and ferrocene as the redox couple, light emission was observed with few bubbles. Greatly reduced bubble formation and lower resistances have been achieved. In the following, a systematic study of the solution resistance and light emission efficiency as a function of electrolyte/redox couple combinations are described. A finding from this experiment was that the redox couples used were not clear, but dark in color, upon dissolution in the solvent. The liquid electrolytes do not have a high extinction coefficient in the visible portion of the spectrum, but are quite absorbing if the path lengths are too long. For example, dissolution of 0.1 M ferrocene in PC produces a liquid that is translucent and has a rusty red-orange color. In lower concentrations (0.05 M), PC with ferrocene has a yellow color. Acetyl ferrocene produces a much darker red liquid and TMPD produces a purple liquid in low concentrations and becomes an almost black liquid at higher concentrations. This finding led to a redesign of the electrochemical cell geometry. In the setup we have used, which was inherited from PAL, the optical path through the liquid absorbs light in the visible spectrum. Therefore, we redesigned the cell to minimize the distance that light traverses as it left the cell. Another useful approach is to go back to aqueous solvents and employ redox couples that are kinetically favored over the electrolysis of water. Using deionized water as the solvent, a non-corrosive salt, like LiCl or NaCl is dissolved to reduce the resistance of the liquid. A redox couple (Fc3+/Fc4+) that reacts with favorable kinetics, provides a current flow mechanism at the electrodes to reduce the likelihood of the electrolysis of water occurring. Finally, the addition of KOH to the liquid would reduce the number of H+ ions in solution, and further discourage the electrolysis process.

Figure 8:
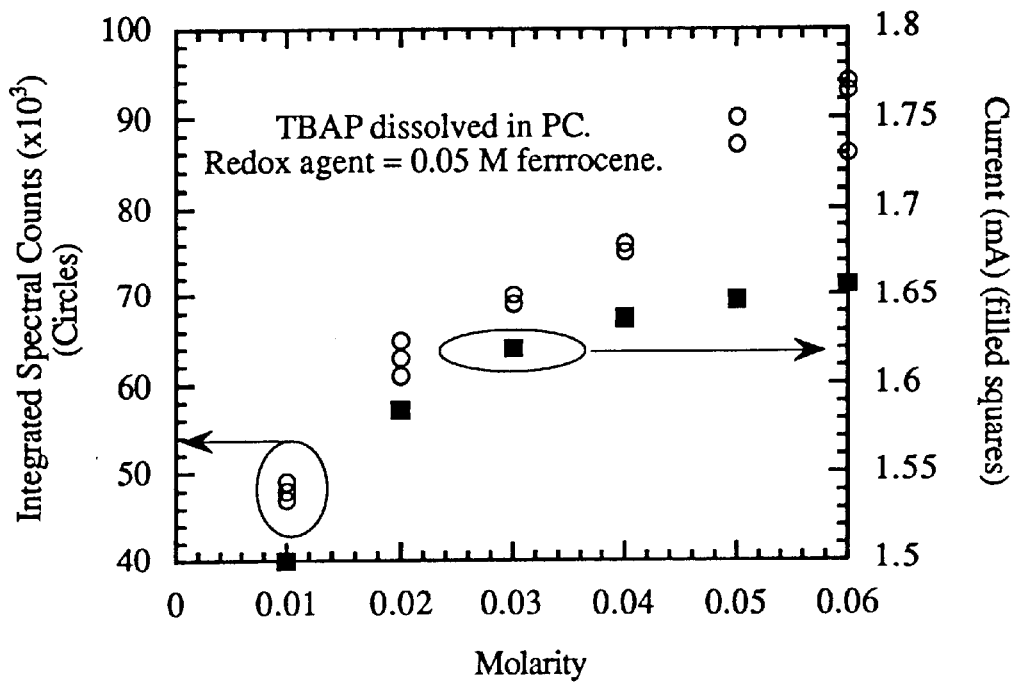
FIG. 8. Integrated spectral counts and cell current vs. TBAP molarity in PC with 0.05 M ferrocene redox couple.
Figure 10:
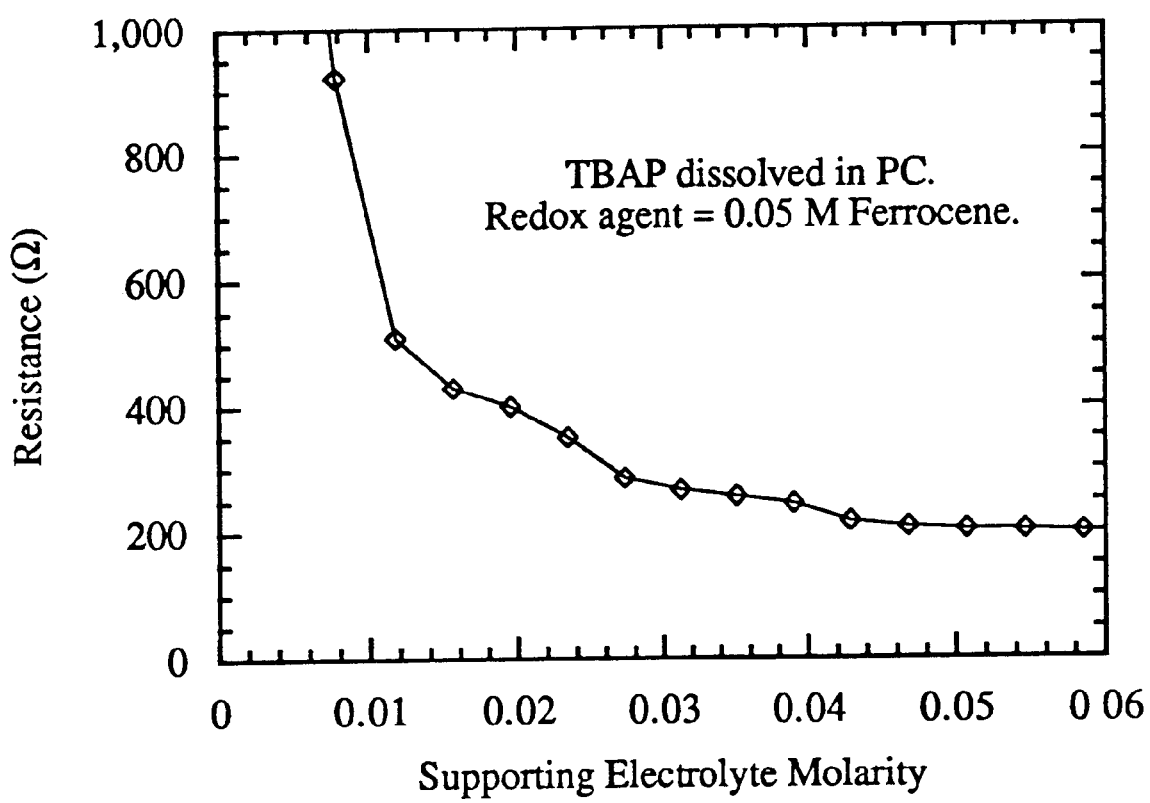
FIG. 10. Electrical resistance of cell as function of TBAP molarity

We studied the relationship between light emission and aprotic electrolyte solution molarity for various combinations of supporting electrolytes and redox couples using PC as the aprotic solvent The first solution combination that was studied used TBAP as the supporting electrolyte and ferrocene as the redox couple. The electrolytic solution was prepared using 100 ml PC as the solvent and 0.9 g (0.05 M) ferrocene. TBAP was then added incrementally to the solution and the light emission properties and current flow were measured at each TBAP molarity. The LCL was performed using a constant current supply (82.5K external resistor). For each TBAP molarity, the current flowing in the LCL circuit was measured and three spectral profiles were measured using the OMA and integrated in order to obtain the integrated spectral counts. As the TBAP molarity was increased, the light emission intensity, represented by the integrated spectral counts in FIG. 8, increased. The current flowing in the cell, represented by filled squares in FIG. 8, also increased and began to saturate. The current increase and saturation tracks closely with the drop in resistance as shown in FIG. 10

Figure 9:
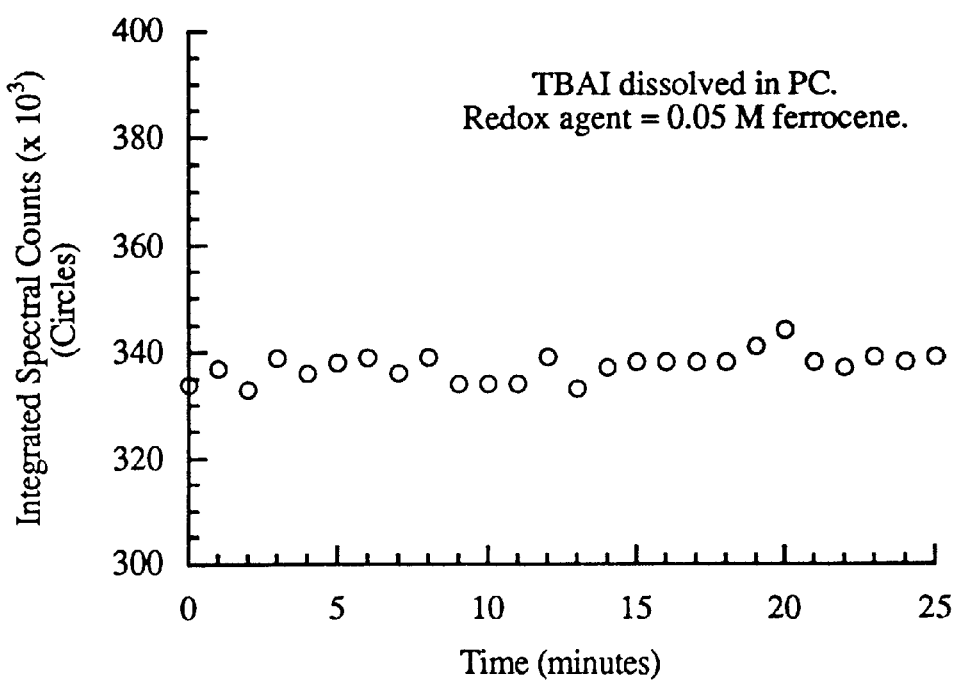
FIG. 9. Integrated spectral counts vs. time for solution with TBAI and ferrocene dissolved in propylene carbonate PC.

In display applications using liquid contacts, this temporal stability of the emission process is also important In fact, the temporal stability requirement for displays will be more stringent than diagnostics because of the long lifetimes expected of displays. Using the LCL setup, samples from wafer X847 were tested under constant current LCL conditions using several supporting electrolyte/redox couple combinations dissolved in PC. In addition, the sample holder was used and a sample from wafer X847 was tested using the GWA electrolyte. FIG. 9 shows constant light emission intensity as a function of time for the TBAI/ferrocene combination dissolved in PC.

We claim:

1. A method of generating light in at least one layer buried in a multilayer compound semiconductor material, the multilayer compound semiconductor material comprising a substrate and a plurality of layers of compound semiconductor material attached to the substrate, comprising;
    contacting a surface of the multilayer compound semiconductor material with an electrically conducting fluid; and
    passing electrical current the electrically conducting fluid and the multilayer compound semiconductor material.
2. The method of claim 1, wherein the electrically conducting fluid contains an aprotic solvent.
3. The method of claim 1, wherein the electrically conducting fluid contains a redox agent.
4. The method of claim 1, wherein the electrically conducting fluid contains a dissolved inert supporting electrolyte.
5. The method of claim 1, wherein at least one characteristic of the light emitted from the multilayer compound semiconductor material is recorded as a function of the electrical current through the material.
6. The method of claim 5, wherein the at least one characteristic of light emitted from a first area on the surface of the multilayer compound semiconductor material is recorded and compared to the at least one characteristic of light emitted from a second area on the surface of the material.
7. The method of claim 1, wherein a hole in an electrically insulating material in proximity to the surface of the multilayer compound semiconductor material defines a light emitting area on the surface of the material.
8. The method of claim 7, wherein at least one characteristic of the light emitted from the defined area on the surface of the multilayer compound semiconductor material is recorded.
9. The method of claim 1, wherein a plurality of holes in an electrically insulating material in proximity to the surface of the multilayer compound semiconductor material define a plurality of light emitting areas on the surface of the material.
10. The method of claim 9, wherein at least one characteristic of the light emitted from at least one of the defined plurality of holes on the surface of the multilayer compound semiconductor material is recorded.

11. The method of claim 9, wherein the electrical currents through the plurality of holes on the surface of the material are controlled thereby creating a desired luminescent pattern.

12. The method of claim 1, wherein the electrically conducting fluid is a molten salt.

13. The method of claim 1, wherein the electrically conducting fluid is a plasma.

14. A method of predicting the performance of semiconductor devices produced from a first multilayer compound semiconductor material, the multilayer compound semiconductor material comprising a substrate and a plurality of layers of compound semiconductor material attached to the substrate, comprising;

contacting a surface of the first multilayer compound semiconductor material with an electrically conducting fluid;

passing electrical current through the electrically conducting fluid and the first multilayer compound semiconductor material;

monitoring at least one characteristic of the light emitted from the first multilayer compound semiconductor material; and comparing that at least one characteristic of the light emitted from the first multilayer compound semiconductor material to the same characteristic of light emitted from a second multilayer compound semiconductor material, the second multilayer compound semiconductor material producing devices having a known performance.

15. The method of claim 14, wherein the electrically conducting fluid comprises an aprotic solvent.

16. The method of claim 14, wherein the electrically conducting fluid contains a redox agent.

17. The method of claim 14, wherein the electrically conducting fluid contains an inert supporting electrolyte.

* * * * *